(12) United States Patent
Kusuura

(10) Patent No.: US 8,026,155 B2
(45) Date of Patent: Sep. 27, 2011

(54) METHOD FOR PRODUCING SEMICONDUCTOR DEVICE

(75) Inventor: Takahisa Kusuura, Kawasaki (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 12/641,079

(22) Filed: Dec. 17, 2009

(65) Prior Publication Data

US 2010/0193913 A1   Aug. 5, 2010

(30) Foreign Application Priority Data

Feb. 4, 2009   (JP) ................................. 2009-023379

(51) Int. Cl.
  *H01L 21/20* (2006.01)
  *H01L 21/36* (2006.01)
  *H01L 29/06* (2006.01)
  *H01L 31/00* (2006.01)
(52) U.S. Cl. .................... 438/478; 438/945; 438/947
(58) Field of Classification Search .................. 438/478, 438/483, 572–577, 603–604
See application file for complete search history.

(56) References Cited

U.S. PATENT DOCUMENTS

| 2007/0018183 A1 | 1/2007 | Denbaars et al. |
| 2010/0276665 A1 * | 11/2010 | Wang ............................. 257/15 |

FOREIGN PATENT DOCUMENTS

| JP | 2002-050585 A | 2/2002 |
| JP | 2003-069073 | 3/2003 |
| JP | 2007-019488 | 1/2007 |
| JP | 2007-019511 | 1/2007 |
| JP | 2007-095845 A | 4/2007 |
| JP | 2007-525016 | 8/2007 |
| JP | 2008-045170 | 2/2008 |
| JP | 2009-502043 | 1/2009 |
| WO | WO 2005/008740 | 1/2005 |
| WO | WO 2007/018789 | 2/2007 |

* cited by examiner

*Primary Examiner* — Ha Tran T Nguyen
*Assistant Examiner* — Valerie N Brown
(74) *Attorney, Agent, or Firm* — Foley & Lardner LLP

(57) ABSTRACT

A method for producing a semiconductor device includes forming an aluminum layer on a core substrate, anodizing the aluminum layer into an alumina layer having a plurality of nanoholes, forming an n-type GaN layer by growing crystals of a compound semiconductor such as an n-type GaN on the alumina layer and inside the nanoholes, and dissolving the alumina layer with an acid. As a result, gaps are formed and a structure in which the core substrate is joined to the n-type GaN layer through portions, other than the gaps, having a very small area is generated. Then a laser beam is applied to the n-type GaN layer through the core substrate to separate the n-type GaN layer from the core substrate by a laser lift-off technique.

19 Claims, 4 Drawing Sheets

METHOD FOR PRODUCING SEMICONDUCTOR DEVICE

CROSS REFERENCE TO RELATED APPLICATION

This application claims the benefit of Japanese Application No. 2009-23379 filed on Feb. 4, 2009 which is incorporated herein by reference.

BACKGROUND OF THE INVENTION

1. Field of the Invention

The present disclosure relates to a method for producing (manufacturing) a semiconductor device.

2. Description of the Related Art

Among known light-emitting diodes (LEDs) which are semiconductor light-emitting devices that use GaN compound semiconductors and the like, there are those which have homojunction structures including p-type compound semiconductors directly joined to n-type compound semiconductors, those which have double heterojunction structures including active layers sandwiched between p-type and n-type compound semiconductors, and those which have quantum well junction structures including quantum well layers sandwiched between p-type and n-type compound semiconductors. Among these junction structures, double heterojunction structures and quantum well junction structures are advantageous for realizing LEDs exhibiting higher luminance, depending on the type of the matrix compound, the type of dopants added to the matrix, the stoichiometry of the compound, etc.

LEDs having such junction structures have been widely produced by, for example, forming junction structures of compound semiconductors constituting the LEDs on buffer layers disposed on light-transmitting supporting substrates such as sapphire substrates. However, when LEDs are formed by using such supporting substrates, the difference in refractive index between the sapphire supporting substrates and compound semiconductor layers (e.g., GaN layers) formed on the sapphire supporting substrates by crystal growth is large. Thus, light is reflected (confined) at the interface between the substrates and the compound semiconductor layers, resulting in lowering of the output efficiency of LEDs' emission (LEDs' emission efficiency). Thus, LEDs having sufficiently high luminance have been difficult to obtain.

In order to enhance the emission efficiency of LEDs, a technique called "laser lift-off" has been proposed and developed which separates the supporting substrates composed of sapphire or the like from the junction structures of the LEDs (refer to Japanese Unexamined Patent Application Publication No. 2007-19511). According to the laser lift-off technique, in general, a junction structure for LEDs is formed on a sapphire supporting substrate, and another supporting substrate is bonded to a surface of the junction structure opposite to the sapphire supporting substrate. Then a laser beam is irradiated to the junction structure through the sapphire supporting substrate to heat the compound semiconductor layer bonded to the sapphire supporting substrate and to thereby separate the junction structure of the LED from the sapphire supporting substrate at the interface between the sapphire supporting substrate and the compound semiconductor layer.

Another technique for enhancing the emission efficiency of LEDs involves forming a free (self)-standing substrate structure using instead of the sapphire substrate a supporting substrate composed of the same compound as the compound semiconductor used in the LED (e.g., in the case where an LED uses GaN, a GaN substrate is used). According to this technique, the decrease in emission efficiency caused by the difference in refractive index between the supporting substrate and the compound semiconductor layer can be eliminated.

However, according to the conventional laser lift-off technique, since separation takes place at the interface between the supporting substrate and the compound semiconductor all parts of which are bonded onto the whole surface of the supporting substrate, an intense laser beam must be used to impart high energy to the compound semiconductor layer. As a result, the heat input (thermal budget) increases significantly. Then thermal stresses readily cause breaking such as cracks, deformations, structural defects, etc., in the compound semiconductor layer separated from the supporting substrate or the upper layers on the compound semiconductor layer. As a result, the product yield tends to decrease.

Meanwhile, supporting substrates composed of the same material as the compound semiconductors constituting LEDs are generally very expensive. For example, if GaN substrates are used, their costs are at least twenty times larger than the cost of sapphire supporting substrates. This is not economically favored for mass production.

Therefore, a method for producing a semiconductor device that can achieve improved production yield by preventing damage on compound semiconductors and junction structures during production processes and offer low-cost, high-luminance light-emitting elements by preventing the increase in production cost is desired.

SUMMARY OF THE INVENTION

An aspect of the present disclosure provides a method for producing a semiconductor device, the method which includes preparing a first supporting member (a first supporting body; substrate which may be a plate or a sheet, the same applies to a second supporting member described below), forming an alumina layer having a plurality of penetrating holes on the first supporting member, forming a first compound semiconductor layer on the alumina layer and inside the penetrating holes, removing the alumina layer, and separating the first compound semiconductor layer from the first supporting member.

According to this method, a porous alumina layer having a plurality of penetrating holes is formed on the first supporting member and part of the surface of the first supporting member is exposed inside the penetrating holes. When crystals of the first compound semiconductor are grown on the alumina layer in such a state, the first compound semiconductor is also deposited inside the penetrating holes in the alumina layer in forming the first compound semiconductor layer, and the first compound semiconductor layer connects to the first supporting member. When the alumina layer is removed, the portions previously occupied by the alumina layer form gaps. Thus, the first compound semiconductor layer on the alumina layer is just joined to the first supporting member through portions other than the gaps. In other words, a structure in which the joint area is extremely small (nanometer-order contact structure) is generated. Accordingly, it becomes significantly easier to separate the first compound semiconductor layer from the first supporting member. Thus, even in the cases where conventional laser lift-off techniques are used and laser beams are applied to the first compound semiconductor layer through the first supporting member, the heat input (thermal budget) can be reduced. Thus, damage on the first compound semiconductor layer can be suppressed.

In particular, the first supporting member may be composed of sapphire.

In forming the alumina layer, an aluminum layer may be formed on the first supporting member and anodized to form the alumina layer having the plurality of penetrating holes. In such a case, because of the anodization (anodic oxidation) of the aluminum layer on the first supporting member, the aluminum layer is electrolytically etched while being oxidized and forms a porous alumina layer having a plurality of penetrating holes (nanometer-order holes or nanoholes), and thereby, part of the surface of the first supporting member becomes exposed in the penetrating holes.

In forming the first compound semiconductor layer, crystals of a group III-V or II-VI compound semiconductor or an oxide semiconductor may be grown on the alumina layer and inside the penetrating holes by chemical vapor deposition (CVD) or physical vapor deposition (PVD) to form the first compound semiconductor layer.

For example, the first compound semiconductor layer may be composed of a semiconductor of one of a p-type and an n-type.

In removing the alumina layer, the alumina layer may be removed by dissolving it in an acidic solution, for example, a phosphoric acid solution. In such a case, since the joint portion between the first compound semiconductor layer and the first supporting member has a significantly small area, the first compound semiconductor layer can be separated from the first supporting member at the same time as dissolution of the alumina layer with the acid depending on the porosity of the alumina layer.

In separating the first compound semiconductor layer from the first supporting member, separation may be conducted by a laser lift-off technique involving irradiating a laser beam to the first compound semiconductor layer through the first supporting member or by mechanical shearing (cutting with ultrasonic waves or a microblade) involving applying force to the first supporting member and the first compound semiconductor layer. As previously mentioned, since the joint portion between the first compound semiconductor layer and the first supporting member has a significantly small area, the heat input can be suppressed and damage on the first compound semiconductor layer can be suppressed even when a laser lift-off technique is employed. Moreover, the separation can be easily accomplished by mechanical shearing.

The method may further include forming a seed layer for the first compound semiconductor layer, the seed layer being formed between the first supporting member and the alumina layer. According to this, the seed layer for the first compound semiconductor on the first supporting member becomes exposed in the penetrating holes and accelerates growth of crystals of the first compound semiconductor depending on the materials for the first compound semiconductor and the forming conditions. Note that in forming the aluminum layer on the first supporting member, a seed layer for the first compound semiconductor may be formed on the first supporting member and then the aluminum layer may be formed on the seed layer on the first supporting member.

The method may further include polishing a surface of the first compound semiconductor layer separated from the first supporting member. Thus, the smoothness of the surface of the first compound semiconductor layer may be enhanced if needed and the emission efficiency of a semiconductor light-emitting device may be enhanced.

The method may further include forming a second compound semiconductor layer on the first compound semiconductor layer. A second supporting member may be provided on the second compound semiconductor layer so that the second supporting member can be used as a supporting substrate for the laser lift-off process.

For example, in forming the second compound semiconductor layer, crystals of a group III-V or II-VI compound semiconductor or an oxide semiconductor may be grown on the first compound semiconductor layer by chemical vapor deposition or physical vapor deposition to form the second compound semiconductor layer.

In such a case, the first compound semiconductor layer may be composed of a semiconductor of one of an n-type and a p-type and the second compound semiconductor layer may be composed of a semiconductor of the other one of the n-type and the p-type.

The method may further include forming an active layer or a quantum well layer between the first compound semiconductor layer and the second compound semiconductor layer. As a result, a double heterojunction structure or a quantum well junction structure which can form light-emitting devices that exhibit higher luminance than the homojunction structures can be formed depending on the type of the semiconductor.

For example, in forming the active layer or the quantum well layer, a group III-V or II-VI compound semiconductor or an oxide semiconductor may be crystallized and grown on the first compound semiconductor layer by chemical vapor deposition or physical vapor deposition to form the active layer or the quantum well layer.

In such a case, the type of the semiconductor constituting the active layer or the quantum well layer may be any one of the p-type and the n-type. A semiconductor having a bandgap lower than those of the first compound semiconductor layer and the second compound semiconductor layer is used in the active layer and a semiconductor that has a dispersed energy level and a tunneling effect is used in the quantum well layer.

The method may further include connecting a first electrode to the first compound semiconductor layer and connecting a second electrode to the second compound semiconductor layer. In the case where the second supporting member disposed on the second compound semiconductor layer has electrical conductivity, the second supporting member may also serve as the second electrode or a separate second electrode may be provided in addition to the second supporting member.

Another aspect of the present disclosure provides a method for producing a semiconductor device, the method which includes preparing a first supporting member composed of sapphire, forming an aluminum layer on the first supporting member, forming an alumina layer with a plurality of penetrating holes by anodization of the aluminum layer, forming a first compound semiconductor layer by growing crystals of a group III-V compound semiconductor, group II-VI compound semiconductor, or oxide semiconductor of one of an n-type and a p-type on the alumina layer and inside the penetrating holes by chemical vapor deposition or physical vapor deposition, forming an active layer or a quantum well layer by growing crystals of a p- or n-type group III-V compound semiconductor, a p or n-type group II-VI compound semiconductor, or a p or n-type oxide semiconductor on the first compound semiconductor layer by chemical vapor deposition or physical vapor deposition, forming a second compound semiconductor layer by growing crystals of a group III-V compound semiconductor, group II-VI compound semiconductor, or oxide semiconductor of the other one of the n-type and p-type on the active layer or the quantum well layer by chemical vapor deposition or physical vapor deposition, removing the alumina layer by dissolving it in a phosphoric acid solution, separating the first compound semiconductor layer from the first supporting member by a laser lift-off technique involving irradiating (applying) a laser beam to the first compound semiconductor layer through the first supporting member or by mechanical shearing involving applying force to the first supporting member and the first compound semiconductor layer, connecting a first electrode to the first compound semiconductor layer, and connecting a second electrode to the second compound semiconductor layer.

It should be noted that removal of the alumina layer may be conducted after formation of the first compound semiconductor layer and before formation of the active layer. As described above, when the alumina layer is dissolved with an acid solution such as phosphoric acid, the first compound semiconductor layer can be separated from the first supporting member simultaneously. The positions where the first and second electrodes are formed are not particularly limited. For example, the first electrode may be a transparent electrode and formed on the first compound semiconductor layer. As described above, the second supporting member having electrical conductivity can also serve as the second electrode or a separate second electrode may be formed on the second supporting member.

DESCRIPTION OF THE PREFERRED EMBODIMENTS

Figure 1:
FIG. 1 is a cross-sectional view showing an example of a condition in a process flow for forming a compound semiconductor layer structure by a method for producing a semiconductor device according to the present disclosure.

Embodiments of the present disclosure will now be described with reference to the drawings. Note that in the drawings, like components are represented by the same reference characters and the description therefor is omitted to avoid redundancy. Moreover, positional relationships such as left, right, up, and down, are based on the positional relationships shown in the drawings unless otherwise noted. Dimensional ratios of the components are not limited to those depicted in the drawings. The description below regarding the embodiments merely provides examples for explaining the present disclosure and in no way limit the scope of the disclosure to those embodiments. Various modifications and alterations are possible within the scope of the essence of the disclosure.

FIGS. 1 to 7 are schematic cross-sectional views of a part of a structure and show an example of a condition in a process flow for forming a compound semiconductor layer structure by a method for producing a semiconductor device according to the present disclosure.

In this embodiment, a core substrate 1 (first supporting member) is prepared first (FIG. 1). The type of the core substrate 1 is not particularly limited. Examples thereof include those composed of single crystal sapphire, zinc oxide (ZnO) and SiC that are relatively inexpensive and exhibit good mechanical properties, chemical stability, and light-transmitting properties. If required, a substrate having an upper surface (as shown in the drawing) chemically and/or mechanically polished to enhance the smoothness may be used. Alternatively, a resin substrate or a resin sheet composed of acryl resins that have good light-transmitting properties or the like may be used as the core substrate 1. Note that as described below, the core substrate 1 does not have to be light-transmitting in the cases where a laser lift-off technique is not employed.

Figure 2:
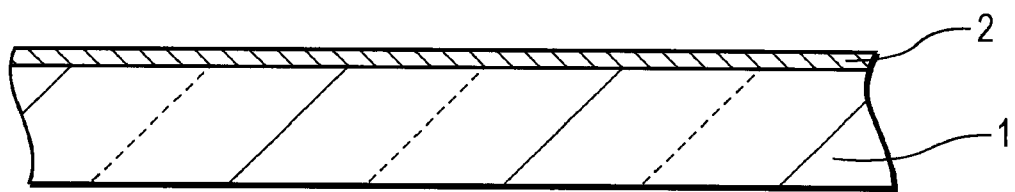
FIG. 2 is a cross-sectional view showing the example of the condition in the process flow for forming the compound semiconductor layer structure.

Next, a seed layer 2 composed of a group III-V compound semiconductor, a group II-VI compound semiconductor, or an oxide semiconductor is formed on the core substrate 1 by crystal growth (FIG. 2). The group III-V compound semiconductor or the group II-VI compound semiconductor may be a binary, tertiary, or quaternary compound. Examples thereof include AlN, GaN, InN, InGaN, ZnCdSe, ZnTeSe, GaP, AlGaInP, InGaN, AlGaAs, GaAs, and InGaAsP. Examples of the oxide semiconductor include ZnO, NiO, $SnO_2$, $TiO_2$, $VO_2$, $In_2O_3$, and $SrTiO_3$.

For example, in the case of using GaN, i.e., a group III-V compound semiconductor, an n-type GaN compound is used in the seed layer 2. Examples of the methods for forming the seed layer 2 include common heteroepitaxial techniques (refer to Japanese Unexamined Patent Application Publication No. 2003-69073 etc.) such as metalorganic chemical vapor deposition (MOCVD), molecular beam epitaxy (MBE) or metalorganic molecular beam epitaxy (MOMBE), gas-source MBE, and chemical beam epitaxy (CBE), and physical vapor deposition (PVD) techniques such as sputtering.

Figure 3:
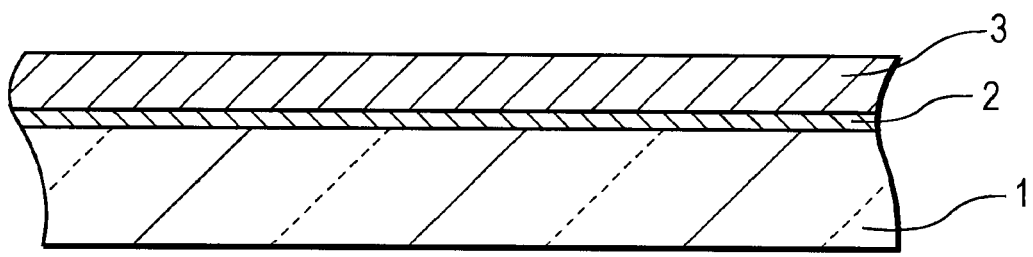
FIG. 3 is a cross-sectional view showing the example of the condition in the process flow for forming the compound semiconductor layer structure.
Figure 4:
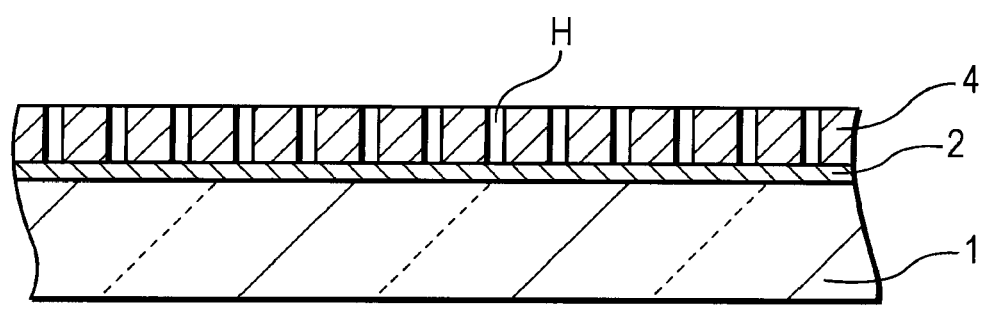
FIG. 4 is a cross-sectional view showing the example of the condition in the process flow for forming the compound semiconductor layer structure.

An aluminum thin film (e.g., a foil or a sheet having a thickness of, for example, 100 to 200 nm) is placed over the seed layer 2, and, if necessary, is pressed to bring the seed layer 2 in close contact with the aluminum thin film and to thereby form an aluminum layer 3 (FIG. 3). A common anodization process is then performed on the aluminum layer 3 to oxidize the aluminum layer 3 while electrochemically etching the aluminum layer 3 from the nanometer-order starting point. As a result, for example, a porous alumina layer 4 having a large number of nanoholes H (penetrating holes) having a diameter on the order of several to several hundred nanometers is formed. When anodization conditions are adequately adjusted during this process, the nanoholes H penetrate the alumina layer 4 in the thickness direction and the surface of the core substrate 1 on which the seed layer 2 is formed becomes exposed in the nanoholes H. Depending on the anodization conditions, the nanoholes H may not penetrate the alumina layer 4 and an alumina barrier layer may remain at the bottom. However, in such a case, wet etching (with an acid solution or the like) or dry etching (such as ion milling) may be performed inside the nanoholes to make the nanoholes H penetrating holes.

Examples of the method for forming the alumina layer 4 having nanometer-sized pores (nanoporous) include methods described in Japanese Unexamined Patent Application Publication No. 2008-45170 and methods similar thereto.

Figure 5:
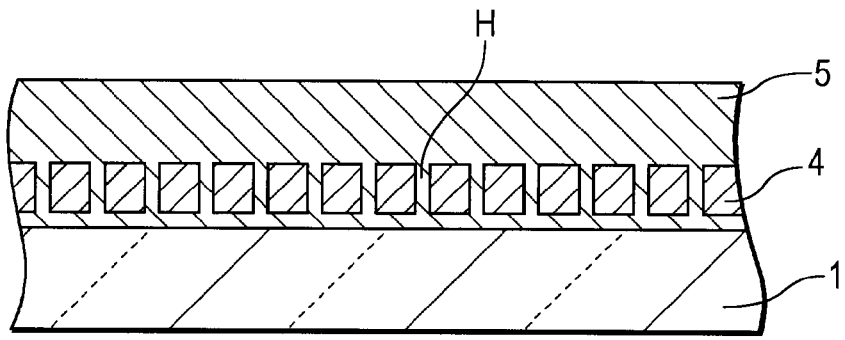
FIG. 5 is a cross-sectional view showing the example of the condition in the process flow for forming the compound semiconductor layer structure.

Then n-type GaN is crystallized and grown by using the seed layer 2 as the starting point to deposit an n-type GaN layer 5 (first compound semiconductor layer) on the alumina layer 4 (FIG. 5). As a result, the nanoholes H in the alumina layer 4 are filled with n-type GaN (FIG. 5) that forms the n-type GaN layer 5. The seed layer 2 composed of the n-type GaN compound becomes part of the n-type GaN layer 5. The n-type GaN layer 5 may be formed by MOCVD, MBE, sputtering, or the like described above.

Figure 6:
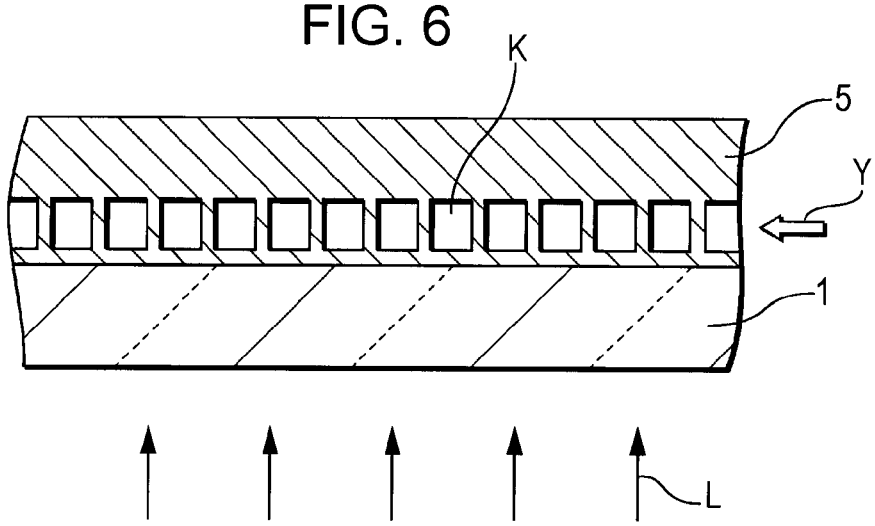
FIG. 6 is a cross-sectional view showing the example of the condition in the process flow for forming the compound semiconductor layer structure.

Next, the structure including the n-type GaN layer 5 is immersed in an acid solution, such as a phosphoric acid solution having an appropriate concentration, which can dissolve alumina to remove the alumina layer 4 by dissolution. As a result, gaps K are formed around the nanoholes H in portions previously occupied by the alumina layer 4 (FIG. 6). Consequently, a structure in which the sapphire core substrate 1 is connected to the n-type GaN layer 5 with fine regions other than the gaps K is formed. In other words, the core substrate 1 is joined to the n-type GaN layer 5 not at their entire surfaces but with nanometer-order contact structures, thereby dramatically reducing the joined area.

Figure 7:
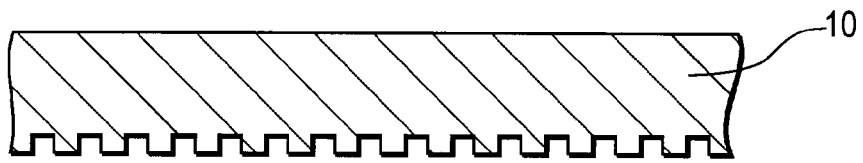
FIG. 7 is a cross-sectional view showing the example of the condition in the process flow for forming the compound semiconductor layer structure.
Figure 8:
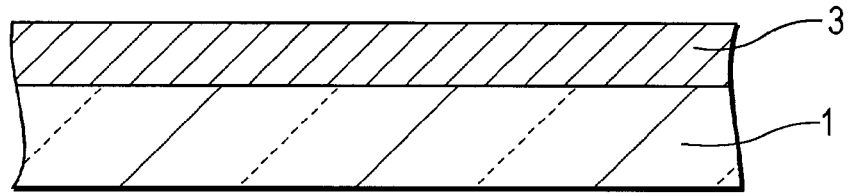
FIG. 8 is a cross-sectional view showing another example of a condition in a process flow for forming a compound semiconductor layer structure.

Then as shown by the upward arrows in FIG. 6, a laser beam L is irradiated to the n-type GaN layer 5 through the core substrate 1 from outside the sapphire core substrate 1. The irradiation energy of the laser beam L is converted to thermal energy and heats the portion of the n-type GaN layer 5 joined to the core substrate 1. During this operation, as described above, the joining portion that joins the n-type GaN layer 5 to the core substrate 1 has a significantly reduced area due to the contact structure formed portions other than the gaps K, and thus, the joining portion, i.e., the portion at the level indicated by arrow Y in FIG. 6, is sufficiently heated despite a small heat input. Thermal deformation caused by such a low heat input allows the n-type GaN layer 5 to easily separate from the core substrate 1. As a result, a single n-type GaN layer 10 (an essential (basic) structure of the semiconductor device of this disclosure) can be obtained (FIG. 7).

Accordingly, a high heat input, such as one required in conventional laser lift-off processes, is no longer necessary to separate the n-type GaN layer 5 from the core substrate 1. Breaking of the n-type GaN layer 5 such as cracking and damage such as lattice defects can thus be suppressed. Note that in FIG. 7, the irregularities (unevenness) in the lower surface of the n-type GaN layer 10 are enlarged to help understanding (the same applies to the shapes of the seed layer 2, the nanoholes H, and the gaps K in other drawings).

FIGS. 8 to 11 are diagrams showing a process of forming a compound semiconductor layer structure according to another embodiment of the method for producing the semiconductor device of the disclosure and are schematic cross-sectional views of part of the structure in the respective conditions.

Figure 9:
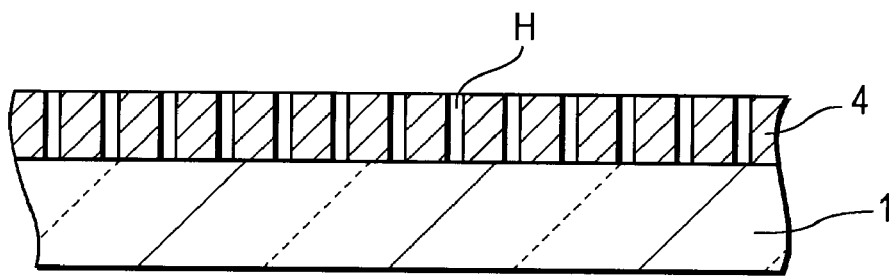
FIG. 9 is a cross-sectional view showing another example of the condition in the process flow for forming the compound semiconductor layer structure.
Figure 10:
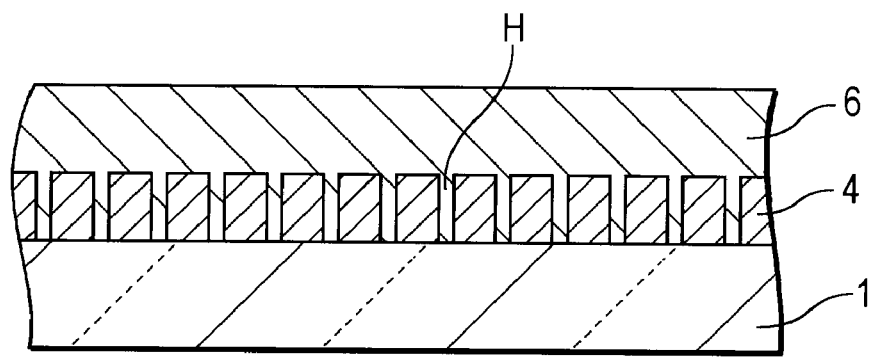
FIG. 10 is a cross-sectional view showing another example of the condition in the process flow for forming the compound semiconductor layer structure.
Figure 11:
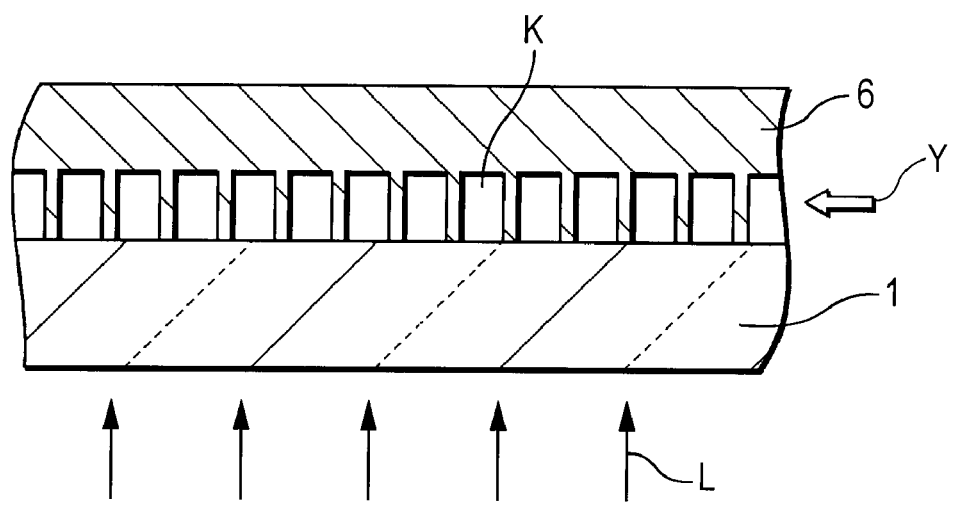
FIG. 11 is a cross-sectional view showing another example of the condition in the process flow for forming the compound semiconductor layer structure.

This embodiment is identical to the method for producing the semiconductor device of the embodiment shown in FIGS. 1 to 7 described above except that the seed layer 2 is not formed. That is, the aluminum layer 3 is directly formed on the sapphire core substrate 1 (FIG. 8) and the aluminum layer 3 is anodized to form the porous alumina layer 4 having a plurality of nanoholes H (FIG. 9). The surface of the core substrate 1 exposed in the nanoholes H is used as the starting point to grow n-type GaN crystals and to thereby form an n-type GaN layer 6 (first compound semiconductor layer) (FIG. 10). Then the alumina layer 4 is removed by dissolution with a phosphoric acid solution or the like to form a multilayer structure including the gaps K (FIG. 11).

In this embodiment also, the laser beam L is irradiated to the n-type GaN layer 6 through the core substrate 1 from outside the sapphire core substrate 1. Thus, the joining portion (portion indicated by the arrow Y in the drawing) between the n-type GaN layer 6 and the core substrate 1 has a sufficiently small area and can be heated with a relatively low heat input. Thus, the n-type GaN layer 6 can be easily separated from the core substrate 1 without damage, and the n-type GaN layer 10 (FIG. 7) can be obtained as a single element.

Figure 12:
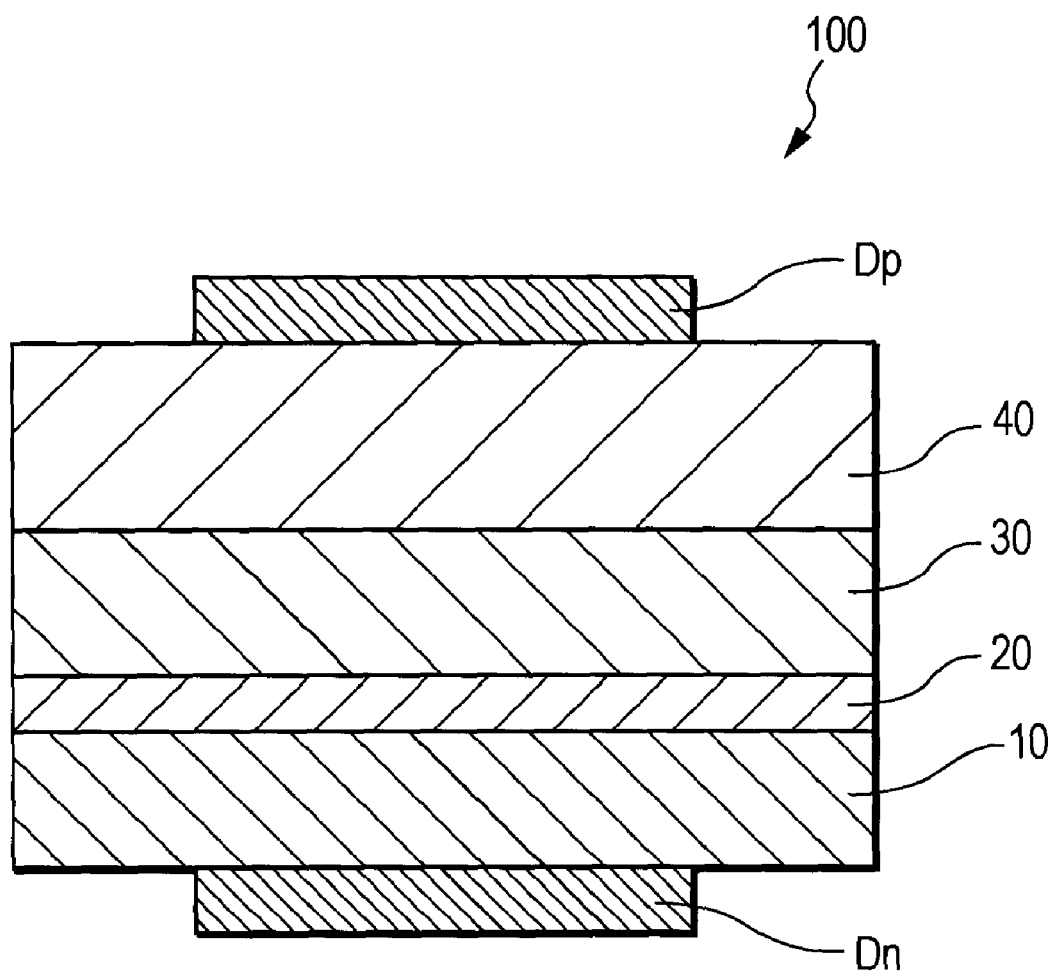
FIG. 12 is a schematic cross-sectional view showing an example of a structure of a light-emitting diode produced by a method for producing a semiconductor device according to a present disclosure.

FIG. 12 is a schematic cross-sectional view showing an example of a structure of an LED made by the method for producing the semiconductor device of this disclosure. An LED 100 includes a junction structure including the n-type GaN layer 10 (first compound semiconductor layer that is an essential constituent of the semiconductor device of the present disclosure as described above), an active layer 20 (which may be quantum dots forming a quantum well layer) disposed on the n-type GaN layer 10, a p-type GaN layer 30 (second semiconductor layer) on the active layer 20, and a supporting substrate 40 (second supporting member) on the p-type GaN layer 30. An n-electrode Dn is joined to the n-type GaN layer 10 and a p-type electrode Dp is joined to the supporting substrate 40.

Examples of the n-type dopant include group IV elements such as C, Si, Ge, and Sn. Examples of the p-type dopant include group II elements such as Be, Mg, Ca, Sr, and Zn.

An example of procedures for producing the LED 100 will now be described. First, before the laser beam L is irradiated to a multilayer structure shown in FIG. 6 or 11, an n- or p-type GaN compound (having a band gap smaller than that of the n-type GaN layer 5 or the n-type GaN layer 6, and that of the p-type GaN layer 30) is formed on the n-type GaN layer 5 or 6 by heteroepitaxial crystal growth such as MOCVD, MBE, or the like mentioned above to form the active layer 20. Then a p-type GaN compound is formed on the active layer 20 by heteroepitaxial crystal growth such as MOCVD or MBE to form the p-type GaN layer 30.

Next, after an appropriate thick film serving as the supporting substrate 40 is formed on the p-type GaN layer 30, the laser beam L is irradiated from the core substrate 1 side as shown in FIG. 6 or 11 so as to heat the joining portion between the core substrate 1 and the n-type GaN layer 5 or 6 to thereby separate the junction structure from the core substrate 1. In FIG. 12, the n-type GaN layer 5 or 6 in the junction structure is indicated as the n-type GaN layer 10 to use the same reference character as in FIG. 7 where the n-type GaN layer is illustrated as a single element. In FIG. 12, fine irregularities (unevenness) in the surface of the n-type GaN layer 10 shown in FIG. 7 are omitted from the depiction.

Subsequently, if necessary, the lower surface of the n-type GaN layer 10 in the drawing is chemically and/or mechanically polished, the n-type electrode Dn is formed on the lower surface of the n-type GaN layer 10, and the p-type electrode Dp is formed on the upper surface of the supporting substrate 40 to obtain the LED 100.

As described above, the present disclosure is not limited to the embodiments described above and various modifications and alterations can be made without departing from the essence of the disclosure. For example, a p-type GaN layer may be formed instead of the n-type GaN layer 5 or 6 (or 10). In such a case, an n-type GaN layer may be formed instead of the p-type GaN layer 30. The supporting substrate 40 is not necessary. The supporting substrate 40 may also function as the p-electrode Dp. Moreover, as described above, group III-V compound semiconductors other than GaN, group II-VI compound semiconductors, and oxide semiconductors may be used as the compound semiconductor as described above.

According to the method for producing the semiconductor device disclosed herein, damage on compound semiconductors and junction structures during the production processes can be prevented, the production yield can be improved, the production efficiency can be increased, and the increase in costs of materials can be suppressed. Thus, high-luminance light-emitting members (light-emitting elements, light-emitting devices, and light-emitting apparatuses) exhibiting high emission efficiencies, such as LEDs can be made at low costs and can be used effectively in various semiconductor devices, components, apparatuses, facilities, systems, and equipment that use those semiconductor devices, and production processes therefor.

What is claimed is:

1. A method for producing a semiconductor device, comprising:
    preparing a first supporting member composed of sapphire;
    forming an aluminum layer on the first supporting member;
    forming an alumina layer with a plurality of penetrating holes by anodization of the aluminum layer;
    forming a first compound semiconductor layer by growing crystals of a group III-V compound semiconductor, group II-VI compound semiconductor, or oxide semiconductor of one of an n-type and a p-type on the alumina layer and inside the penetrating holes by chemical vapor deposition or physical vapor deposition;
    forming an active layer or a quantum well layer by growing crystals of a p- or n-type group III-V compound semiconductor, a p- or n-type group II-VI compound semiconductor, or a p- or n-type oxide semiconductor on the first compound semiconductor layer by chemical vapor deposition or physical vapor deposition;
    forming a second compound semiconductor layer by growing crystals of a group III-V compound semiconductor, group II-VI compound semiconductor, or oxide semiconductor of the other one of the n-type and p-type on the active layer or the quantum well layer by chemical vapor deposition or physical vapor deposition;
    removing the alumina layer by dissolving it in a phosphoric acid solution;
    separating the first compound semiconductor layer from the first supporting member by a laser lift-off technique involving irradiating a laser beam to the first compound semiconductor layer through the first supporting member or by mechanical shearing involving applying force to the first supporting member and the first compound semiconductor layer;
    connecting a first electrode to the first compound semiconductor layer; and
    connecting a second electrode to the second compound semiconductor layer.

2. A method for producing a semiconductor device, comprising:
    preparing a first supporting member;
    forming an alumina layer with a plurality of penetrating holes on the first supporting member;
    forming a first compound semiconductor layer on the alumina layer and inside the penetrating holes;
    removing the alumina layer; and
    separating the first compound semiconductor layer from the first supporting member.

3. The method according to claim 2, wherein the first supporting member is composed of sapphire.

4. The method according to claim 2, wherein, in said forming the alumina layer, an aluminum layer is formed on the first supporting member and anodized to form the alumina layer having the plurality of penetrating holes.

5. The method according to claim 2, wherein, in said forming the first compound semiconductor layer, crystals of a group III-V or II-VI compound semiconductor or an oxide semiconductor are grown on the alumina layer and inside the penetrating holes by chemical vapor deposition or physical vapor deposition to form the first compound semiconductor layer.

6. The method according to claim 2, wherein the first compound semiconductor layer is composed of a semiconductor of one of a p-type and an n-type.

7. The method according to claim 2, wherein, in said removing the alumina layer, the alumina layer is removed by dissolving it in an acidic solution.

8. The method according to claim 7, wherein the acidic solution is a phosphoric acid solution.

9. The method according to claim 2, wherein, in said separating the first compound semiconductor layer from the first supporting member, separation is conducted by a laser lift-off technique involving applying a laser beam to the first compound semiconductor layer through the first supporting member or by mechanical shearing involving applying force to the first supporting member and the first compound semiconductor layer.

10. The method according to claim 2, further comprising: forming a seed layer for the first compound semiconductor layer, the seed layer being formed between the first supporting member and the alumina layer.

11. The method according to claim 2, further comprising: polishing a surface of the first compound semiconductor layer separated from the first supporting member.

12. The method according to claim 2, further comprising: forming a second compound semiconductor layer on the first compound semiconductor layer.

13. The method according to claim 12, wherein, in said forming the second compound semiconductor layer, crystals of a group III-V or II-VI compound semiconductor or an oxide semiconductor are grown on the first compound semiconductor layer by chemical vapor deposition or physical vapor deposition to form the second compound semiconductor layer.

14. The method according to claim 12, wherein the first compound semiconductor layer is composed of a semiconductor of one of an n-type and a p-type and the second compound semiconductor layer is composed of a semiconductor of the other one of the n-type and the p-type.

15. The method according to claim 12, further comprising: forming an active layer or a quantum well layer between the first compound semiconductor layer and the second compound semiconductor layer.

16. The method according to claim 15, wherein, in said forming the active layer or the quantum well layer, crystals of a group III-V or II-VI compound semiconductor or an oxide semiconductor are grown on the first compound semiconductor layer by chemical vapor deposition or physical vapor deposition to form the active layer or the quantum well layer.

17. The method according to claim 15, wherein the active layer or the quantum well layer is composed of a semiconductor of a p-type or an n-type.

18. The method according to claim 12, further comprising: connecting a first electrode to the first compound semiconductor layer; and connecting a second electrode to the second compound semiconductor layer.

19. A semiconductor device produced by preparing a first supporting member;

forming an alumina layer with a plurality of penetrating holes on the first supporting member;

forming a first compound semiconductor layer on the alumina layer and inside the penetrating holes;

removing the alumina layer; and separating the first compound semiconductor layer from the first supporting member.

* * * * *

UNITED STATES PATENT AND TRADEMARK OFFICE
CERTIFICATE OF CORRECTION

| | | |
|---|---|---|
| PATENT NO. | : 8,026,155 B2 | Page 1 of 1 |
| APPLICATION NO. | : 12/641079 | |
| DATED | : September 27, 2011 | |
| INVENTOR(S) | : Kusuura | |

It is certified that error appears in the above-identified patent and that said Letters Patent is hereby corrected as shown below:

In Column 5, Line 63, delete "DESCRIPTION" and insert -- DETAILED DESCRIPTION --, therefor.

In Column 11, Line 8, in Claim 19, delete "by" and insert -- by: --, therefor.

Signed and Sealed this
Twenty-fourth Day of April, 2012

David J. Kappos
*Director of the United States Patent and Trademark Office*